(12) United States Patent
Woo

(10) Patent No.: US 11,960,097 B2
(45) Date of Patent: Apr. 16, 2024

(54) COMBINED LENSES-BASED APPARATUS FOR LINE LASER UNIFORMITY GENERATION

(71) Applicant: ELITE OPTOELECTRONICS CO., LTD, Shaanxi (CN)

(72) Inventor: Yanlin Woo, Shaanxi (CN)

(73) Assignee: ELITE OPTOELECTRONICS CO., LTD, Shaanxi (CN)

( * ) Notice: Subject to any disclaimer, the term of this patent is extended or adjusted under 35 U.S.C. 154(b) by 118 days.

(21) Appl. No.: 17/534,470

(22) Filed: Nov. 24, 2021

(65) Prior Publication Data

US 2022/0082844 A1 Mar. 17, 2022

Related U.S. Application Data

(63) Continuation of application No. PCT/CN2020/094736, filed on Jun. 5, 2020.

(30) Foreign Application Priority Data

May 30, 2019 (CN) .......................... 201920805160.1

(51) Int. Cl.
*G02B 3/06* (2006.01)
*G02B 3/04* (2006.01)
*G02B 27/09* (2006.01)

(52) U.S. Cl.
CPC ........... *G02B 27/0916* (2013.01); *G02B 3/04* (2013.01); *G02B 3/06* (2013.01)

(58) Field of Classification Search
CPC .............................. G02B 3/06; G02B 27/0927
See application file for complete search history.

(56) References Cited

U.S. PATENT DOCUMENTS

2006/0176912 A1* 8/2006 Anikitchev ........ G02B 19/0014
372/9

FOREIGN PATENT DOCUMENTS

| CN | 203241622 U | 10/2013 |
|---|---|---|
| CN | 103701026 A | 4/2014 |
| CN | 109143594 A | 1/2019 |
| CN | 109581671 A | 4/2019 |
| CN | 209803465 U | 12/2019 |
| JP | 2004301755 A | 10/2004 |

* cited by examiner

*Primary Examiner* — Joseph P Martinez

(57) ABSTRACT

Disclosed is a combined lenses-based apparatus for line laser uniformity generation. The apparatus includes a laser diode, and an aspheric focusing lens and combined lenses that are arranged behind the laser diode sequentially. The combined lenses include a cylindrical lens and a plano-convex cylindrical lens. The cylindrical lens and the plano-convex cylindrical lens are arranged on an optical path sequentially. One end surface of the aspheric focusing lens is an aspheric surface. Light emitted by the laser diode is focused by passing though the aspheric focusing lens, and the combined lenses are able to disperse a focused beam into uniform line laser.

9 Claims, 5 Drawing Sheets

COMBINED LENSES-BASED APPARATUS FOR LINE LASER UNIFORMITY GENERATION

CROSS-REFERENCE TO RELATED APPLICATION

The present application is a continuation of International Application No. PCT/CN2020/094736, filed on Jun. 5, 2020, which claims priority to Chinese patent application No. 201920805160.1, filed on May 30, 2019, both of which are hereby incorporated by reference in their entireties.

TECHNICAL FIELD

The present disclosure relates to line laser generation apparatuses, and more particularly, to a combined lenses-based apparatus for line laser uniformity generation.

BACKGROUND

Semiconductor lasers are a class of lasers that use semiconductor materials as working materials of laser, have characteristics of small size, light weight, wide wavelength range, and high coherence, and are suitable for mass production. In the early 1980s, the semiconductor lasers were mainly applied in optical fiber communication technology, and are still indispensable and vital devices in the field of optical communication. Since the 1990s, as the optoelectronic technology continues to mature, the demand for the optoelectronic technology in various fields has become higher and higher, making fields of application of the optoelectronic technology continue to expand. With continuous deepening of research on the semiconductor lasers, the semiconductor lasers have become an indispensable device in military, medical, material processing, printing, and optical communications fields.

Line laser is converted from point laser through an optical lens, and can be used in button sewing machines, riveting machines, pocket opening machines, cutting tables, tacking machines, spreading machines, etc. The use of the line laser is convenient, easy, intuitive and practical, and can greatly improve working efficiency. The line laser produces clear lines, is small and easy to install, and can provide supporting products and technical support for various clothing equipment manufacturers. An installation machine of a laser marking device is easy and convenient to use. The installation machine can be installed on a vertical or horizontal surface of a machine using the installation machine to provide a visible laser marking line, such that there is a visible, non-contact positioning line to guide an operation process throughout a production process, thereby resulting in advantages of convenient production operations and improved production efficiency. A laser line can be arbitrarily fine-tuned in a three-dimensional space to achieve the best use effect. At present, the line laser on the market is mainly obtained by a cylindrical lens and a Powell lens.

An ordinary spherical cylindrical lens can turn a laser beam into line laser after the laser beam passes through the ordinary spherical cylindrical lens. The production process of the ordinary spherical cylindrical lens is relatively simple and can be mass-produced. However, since light spots of a laser diode light source present Gaussian distribution basically, light spots of the line laser obtained with the ordinary spherical cylindrical lens still present an approximate Gaussian distribution, and the energy distribution is uneven. With the development of 3D structured light and machine vision, accuracy requirements for one-dimensional laser line projection are getting higher and higher, which are mainly reflected in straightness and a degree of central symmetry of the projected line, and the uniformity of the energy of the projected line. The straightness and degree of symmetry can be fine-tuned through lens to achieve a fairly high accuracy, while it is difficult to change a disadvantage that center energy is much higher than edge energy since energy uniformity is restricted by characteristics of beams from a semiconductor laser diode. The Powell lens is an optical marking prism (an aspheric cylindrical lens), which allows the laser beam to be optimized into a straight line with uniform optical density, good stability and good linearity after passing through it. The uniformity of projected lines of the Powell lens is better than a marking mode of the cylindrical lens, and may eliminate the distribution of central hot spot and faded edge of Gaussian beam. However, one of the characteristics of the Powell lens has strict requirements on a size of an incident beam. The size being large or small will affect the uniformity of the emitted light at a target position. Also, the size of the incident beam is generally required to be relatively small. When a working distance is long, a small outlet size will greatly affect a width of the projected line, and at the same time, affect alignment of the axis, so the process is very inconvenient in actual production. A thickness does not affect an angle of the emitted light, but it affects the uniformity of the target position. Therefore, product specifications of Powell lenses will specify requirements of sizes of the incident beam, and mark parameters such as diameter and thickness. In addition, the top of the Powell lens is a complex two-dimensional aspheric surface. It is because of these characteristics that Powell lenses cannot be mass-produced and are expensive. A special DOE diffractive lens can also achieve one-dimensional beam, and can achieve more complicated beam projection. However, DOE has strict requirements on laser wavelength and spectral width, forms linewidth accuracy that is difficult to achieve a micron level, and has serious stray light. The processing cost of the DOE diffractive lens is high. Consequently, an application range of the DOE diffractive lens is limited.

SUMMARY

In view of the above problems in the related art, the present disclosure is to provide a combined lenses-based apparatus for line laser uniformity generation, aiming to generate line laser with uniform optical density, good stability and good linearity. The apparatus is at a low cost and easy to implement.

To achieve the above objectives, technical solutions adopted by the present disclosure lie in: including a laser diode, and an aspheric focusing lens and combined lenses that are arranged behind the laser diode sequentially, the combined lenses including a cylindrical lens and a plano-convex cylindrical lens, the cylindrical lens and the plano-convex cylindrical lens being arranged on an optical path sequentially, one end surface of the aspheric focusing lens being an aspheric surface, light emitted by the laser diode being focused by passing though the aspheric focusing lens, and the combined lenses dispersing a focused beam into uniform line laser.

The cylindrical lens is coaxial with the plano-convex cylindrical lens, the cylindrical lens disperses a laser beam into line laser, and the plano-convex cylindrical lens focuses light diverging from two ends of a line light source to a middle, so as to uniformize the line laser with an uneven energy distribution.

A convex surface a flat surface of the plano-convex cylindrical lens faces the cylindrical lens.

A laser linewidth decreases as a distance between the cylindrical lens and the aspheric focusing lens decreases, and the laser linewidth increases as the distance between the cylindrical lens and the aspheric focusing lens increases.

A detector is provided on the optical path behind the plano-convex cylindrical lens, and a linewidth deceases as a distance between the plano-convex cylindrical lens and the detector decreases.

The aspheric focusing lens is made of an optical glass material D-ZK3.

Each of the cylindrical lens and the plano-convex cylindrical lens is made of an optical glass material BK7.

Compared with the related art, the present disclosure has the following beneficial effects. The laser diode uses a standard optoelectronic device, and has high electro-optical conversion efficiency. Light emitted by the laser diode is focused by passing though the aspheric focusing lens, and the combined lenses disperse a focused beam into uniform line laser. The plano-convex cylindrical lens focuses light diverging from two ends of a line light source to a middle, so as to make the energy distribution of an entire line light source uniform. The cylindrical lens and the plano-convex cylindrical lens follow certain optical laws, and their distributions may be determined based on requirements of the entire optical system. By integrating advantages of optical structures of two kinds of line laser into a structure of the apparatus, the present disclosure may not only generate line laser having uniform optical density, good stability, and good linearity, but also achieve large-scale industrial mass production. The present disclosure is cheap, easy to implement, and has a broad application prospect. In addition, the present disclosure has low requirements for parameters such as size, diameter, and thickness of an incident beam, and devices having the same specification may be adjusted to meet different target requirements.

1—laser diode; 2—aspheric focusing lens; 3—combined lenses; 4—detector; 21—cylindrical lens; 22—plano—convex cylindrical lens

DESCRIPTION OF EMBODIMENTS

The present disclosure will be further described in detail below in combination with the accompanying drawings.

Figure 1:
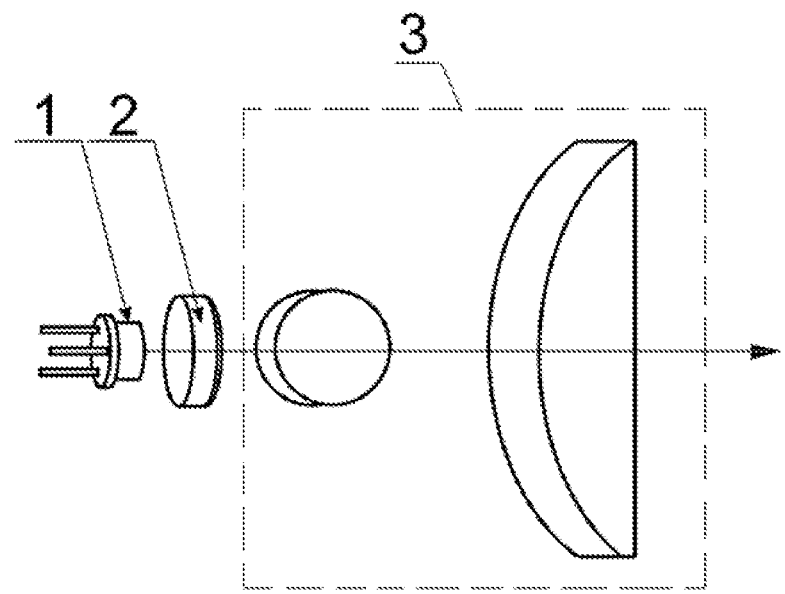
FIG. 1 is a schematic diagram showing a structure of a plano-convex cylindrical lens with a convex surface facing a cylindrical lens according to the present disclosure.
Figure 2:
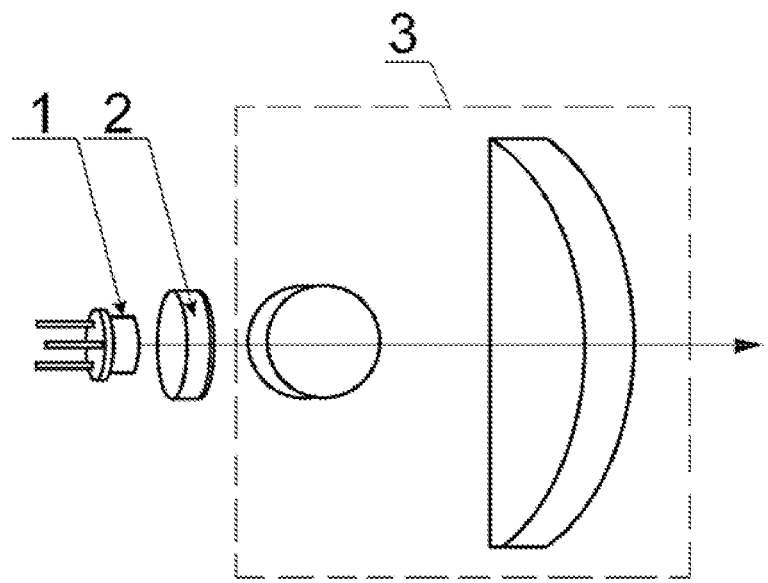
FIG. 2 is a schematic diagram showing a structure of a plano-convex cylindrical lens with a flat surface facing a cylindrical lens according to the present disclosure.

Referring to FIGS. 1-2, the present disclosure includes a laser diode 1, an aspheric focusing lens 2 and combined lenses 3 in structure. After light emitted by the laser diode 1 is focused by the aspheric focusing lens 2, the combined lenses 3 disperse a beam into uniform line laser. The laser diode 1 is a standard optoelectronic device with high electro-optical conversion efficiency. One end surface of the aspheric focusing lens 2 is an aspheric surface, and a material of the aspheric focusing lens 2 is D-ZK3. The combined lenses 3 include a cylindrical lens 21 and a plano-convex cylindrical lens 22, which are all made of BK7.

Figure 3:
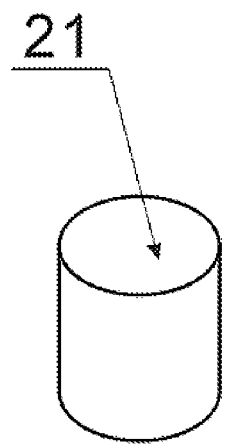
FIG. 3 is a schematic diagram showing a structure of a cylindrical lens according to the present disclosure.
Figure 4:
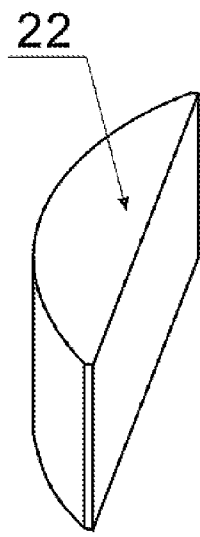
FIG. 4 is a schematic diagram showing a structure of a plano-convex cylindrical lens according to the present disclosure.

Referring to FIGS. 3-4, the combined lenses 3 of the present disclosure include the cylindrical lens 21 and the plano-convex cylindrical lens 22. The cylindrical lens 21 is coaxial with the plano-convex cylindrical lens 22. A convex surface or a flat surface of the plano-convex cylindrical lens 22 faces the cylindrical lens 21. The cylindrical lens 21 disperses a laser beam into line laser. The plano-convex cylindrical lens 22 may focus light diverging from two ends of a line light source to a middle, so that energy distribution of the entire line light source is uniform. A distance between the cylindrical lens 21 and the plano-convex cylindrical lens 22 may be determined based on requirements of an entire optical system. The cylindrical lens 21 and the plano-convex cylindrical lens 22 follow the following rules: a laser linewidth decreases as a distance between the cylindrical lens 21 and the aspheric focusing lens 2 decreases, and the laser linewidth increases as the distance between the cylindrical lens 21 and the aspheric focusing lens 2 increases; and a linewidth deceases as a distance between the plano-convex cylindrical lens 22 and the detector decreases.

Figure 5:
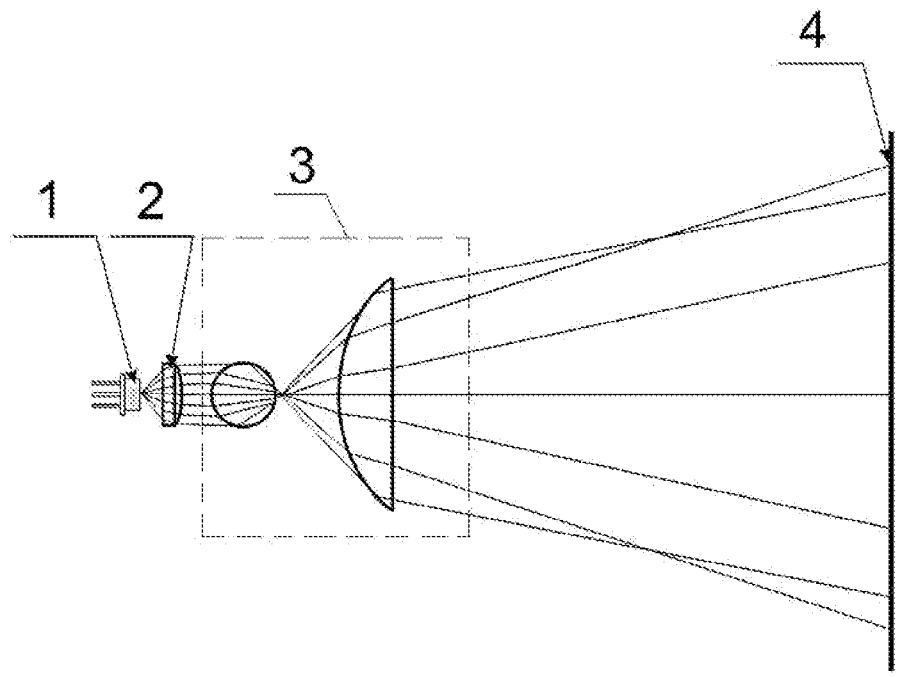
FIG. 5 is a schematic diagram showing a linelength optical path of a plano-convex cylindrical lens with a convex surface facing a cylindrical lens according to the present disclosure.
Figure 6:
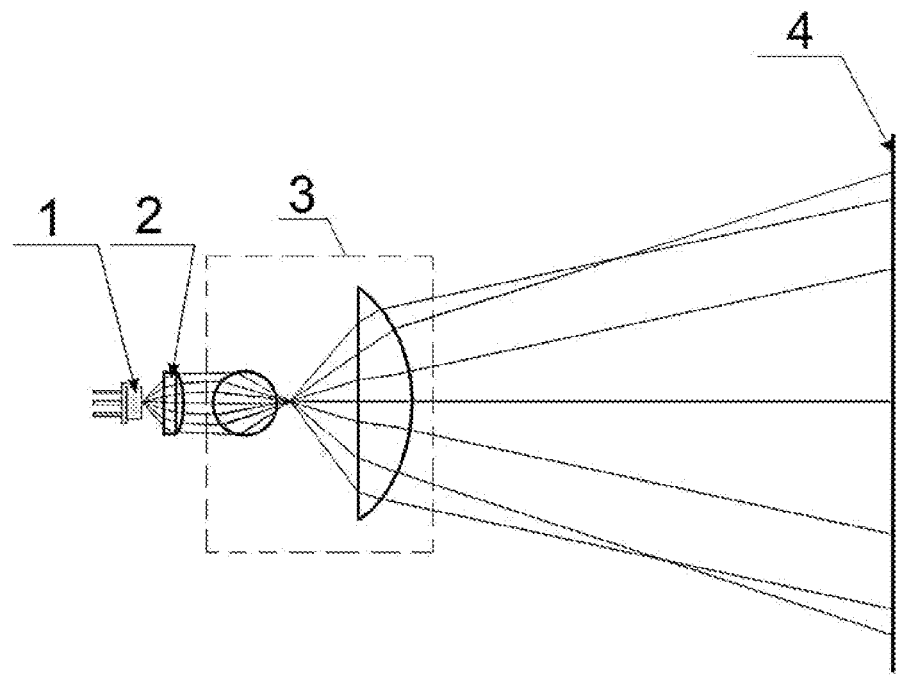
FIG. 6 is a schematic diagram showing a linelength optical path of a plano-convex cylindrical lens with a flat surface facing a cylindrical lens according to the present disclosure.

Referring to FIGS. 5-6, according to the present disclosure, the laser light emitted by the laser diode 1 is focused by the aspheric focusing lens 2, and then passes through the combined lenses 3. The cylindrical lens 21 in the combined lenses 3 diverges the laser beam into the line laser. The plano-convex cylindrical lens 22 makes the line laser with uneven energy distribution uniform, and finally irradiates the line laser on the detector 4.

Figure 7:
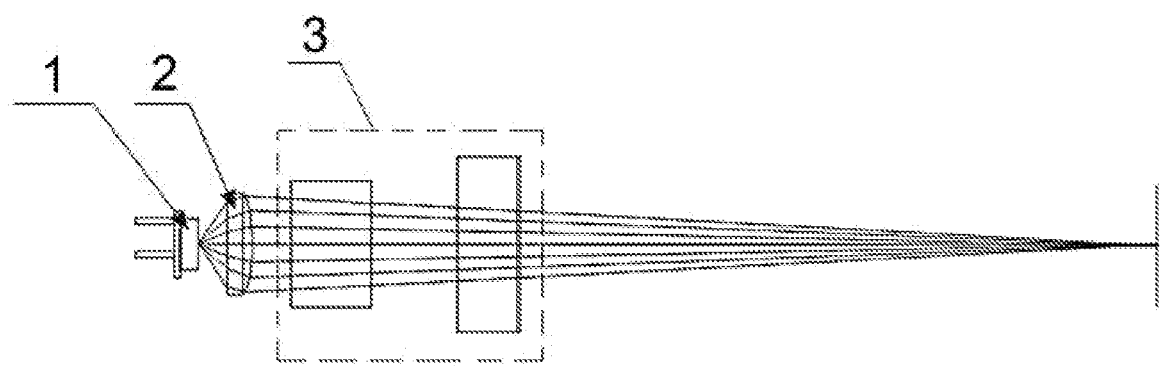
FIG. 7 is a schematic diagram showing a linewidth optical path according to the present disclosure.

Referring to FIG. 7, linewidth distribution of the entire optical system of the present disclosure is basically determined by the aspheric focusing lens 2. The laser beam emitted by the laser diode 1 is focused by the aspheric focusing lens 2, passes through the combined lenses 3, and reaches the detector 4. During this period, an optical path of the beam does not change significantly. The linewidth is the thinnest at a focal length of the entire optical system. The farther from the focal length, the wider the linewidth.

Figure 8:
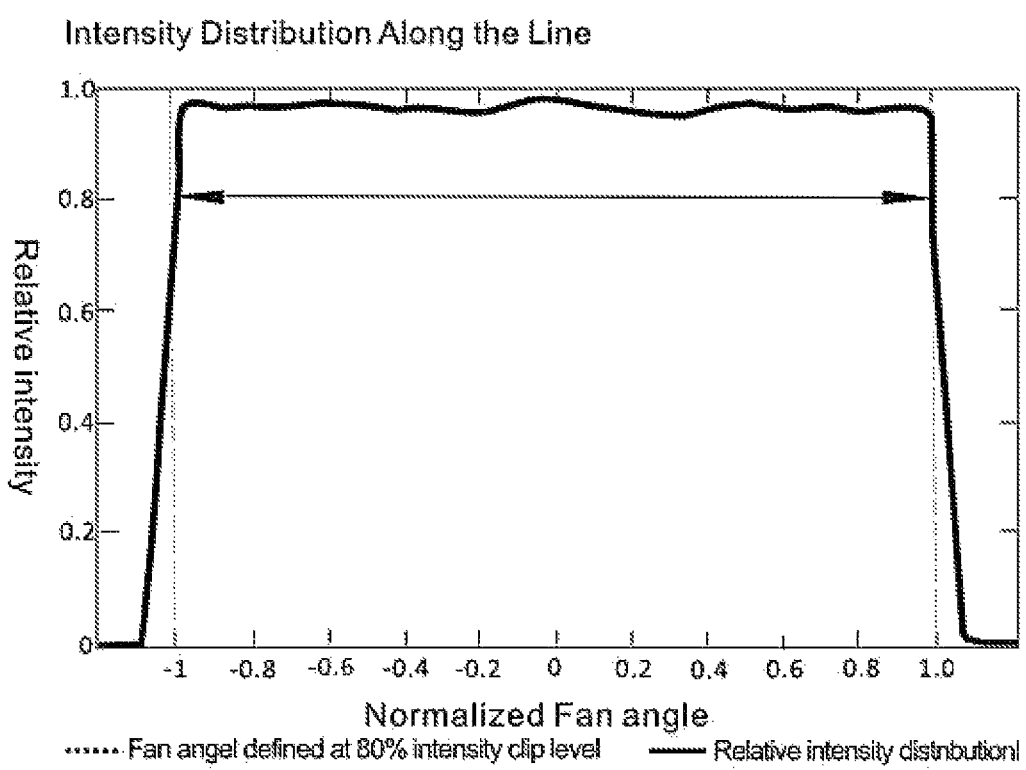
FIG. 8 is a test graph of lateral distribution of a beam according to the present disclosure.
Figure 9:
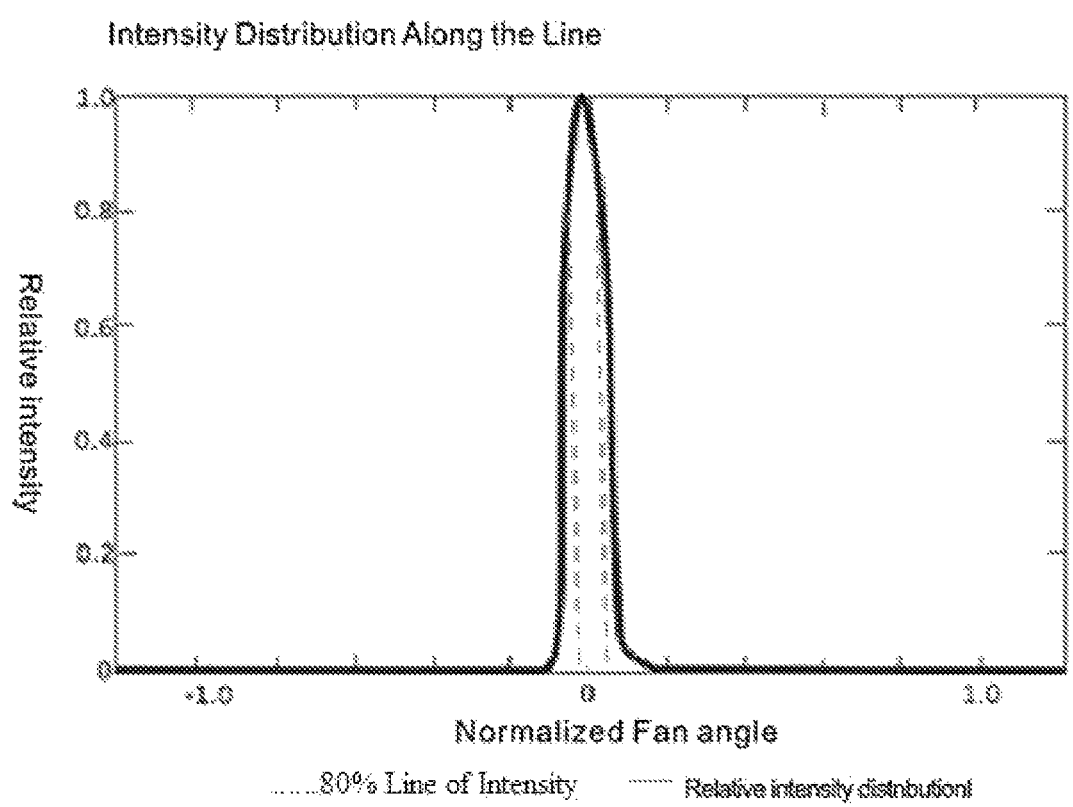
FIG. 9 is a test graph of longitudinal distribution of a beam according to the present disclosure.

Referring to FIG. 8, an analysis of a detection result of the detector 4 shows that energy distribution of the beam is basically uniform except for beam at a small distance from each of two ends of the beam. Referring to FIG. 9, beam energy distribution is concentrated, and there is only one peak. Consequently, the beam quality is excellent.

The above description is merely preferred embodiments of the present disclosure, and is not used to limit solutions in any form. It can be appreciated by those skilled in the art that, without departing from the spirit and principle of the present disclosure, modifications and replacements may be performed on the technical solutions in a number of simple ways. These modifications and replacements also fall within the protection scope defined by the attached claims.

What is claimed is:

1. A combined lenses-based apparatus for line laser uniformity generation, comprising: a laser diode (1), and an aspheric focusing lens (2) and combined lenses (3) that are arranged behind the laser diode (1) sequentially, the combined lenses (3) comprising a cylindrical lens (21) and a plano-convex cylindrical lens (22), the cylindrical lens (21) and the plano-convex cylindrical lens (22) being arranged on an optical path sequentially, one end surface of the aspheric focusing lens (2) being an aspheric surface, light emitted by the laser diode (1) being focused in a linewidth direction of line laser and in a linelength direction of line laser by passing though the aspheric focusing lens (2), and the combined lenses (3) dispersing a focused beam in the linelength direction of line laser into uniform line laser.

2. The combined lenses-based apparatus of claim 1, wherein the cylindrical lens (21) is coaxial with the plano-convex cylindrical lens (22), the cylindrical lens (21) disperses a laser beam into line laser, and the plano-convex cylindrical lens (22) focuses light diverging from two ends of a line light source to a middle, so as to uniformize the line laser with an uneven energy distribution.

3. The combined lenses-based apparatus of claim 1, wherein a convex surface or a flat surface of the plano-convex cylindrical lens (22) faces the cylindrical lens (21).

4. The combined lenses-based apparatus of claim 2, wherein a convex surface or a flat surface of the plano-convex cylindrical lens (22) faces the cylindrical lens (21).

5. The combined lenses-based apparatus of claim 1, wherein a laser linewidth decreases as a distance between the cylindrical lens (21) and the aspheric focusing lens (2) decreases, and the laser linewidth increases as the distance between the cylindrical lens (21) and the aspheric focusing lens (2) increases.

6. The combined lenses-based apparatus of claim 2, wherein a laser linewidth decreases as a distance between the cylindrical lens (21) and the aspheric focusing lens (2) decreases, and the laser linewidth increases as the distance between the cylindrical lens (21) and the aspheric focusing lens (2) increases.

7. The combined lenses-based apparatus of claim 1, wherein a detector (4) is provided on the optical path behind the plano-convex cylindrical lens (22), and a linewidth deceases as a distance between the plano-convex cylindrical lens (22) and the detector (4) decreases.

8. The combined lenses-based apparatus of claim 1, wherein the aspheric focusing lens (2) is made of an optical glass material D-ZK3.

9. The combined lenses-based apparatus of claim 1, wherein each of the cylindrical lens (21) and the plano-convex cylindrical lens (22) is made of an optical glass material BK7.

* * * * *